United States Patent [19]

Burns

[11] Patent Number: 4,607,779
[45] Date of Patent: Aug. 26, 1986

[54] NON-IMPACT THERMOCOMPRESSION GANG BONDING METHOD

[75] Inventor: Carmen D. Burns, San Jose, Calif.

[73] Assignee: National Semiconductor Corporation, Santa Clara, Calif.

[21] Appl. No.: 522,146

[22] Filed: Aug. 11, 1983

[51] Int. Cl.[4] ............................................. B23K 19/00
[52] U.S. Cl. ................................ 228/106; 228/180.2; 228/212; 228/240; 228/234
[58] Field of Search ................ 228/5.5, 6, 106, 180 A, 228/219, 220, 180.2, 240, 212, 234; 29/739, 740, 743, 832, 833, 834

[56] References Cited

U.S. PATENT DOCUMENTS

| | | | |
|---|---|---|---|
| 3,158,927 | 12/1964 | Saunders | 228/180 A X |
| 3,486,223 | 12/1969 | Butera | 228/219 X |
| 3,617,682 | 11/1971 | Hall | 228/219 X |
| 3,633,267 | 1/1972 | Deminet et al. | 228/106 X |
| 3,646,670 | 3/1972 | Maeda et al. | 228/180 A X |
| 3,665,590 | 5/1972 | Percival | 228/220 |
| 3,670,396 | 6/1972 | Lindberg | 228/106 |
| 3,838,240 | 9/1974 | Schelhorn | 228/219 X |
| 3,859,723 | 1/1975 | Hamer et al. | 228/180.2 |
| 3,941,297 | 3/1976 | Burns et al. | 228/180.2 |
| 3,964,666 | 6/1976 | Dinella et al. | 228/106 |
| 3,982,979 | 9/1976 | Hentz et al. | 228/180 A X |
| 4,000,842 | 1/1977 | Burns | 228/180 A X |
| 4,204,628 | 5/1980 | Houston et al. | 228/106 |
| 4,209,355 | 6/1980 | Burns | 29/589 X |

FOREIGN PATENT DOCUMENTS 3127120  1/1983  Fed. Rep. of Germany ........ 29/832

*Primary Examiner*—Kenneth J. Ramsey
*Assistant Examiner*—M. Jordan
*Attorney, Agent, or Firm*—Gail W. Woodward; Paul J. Winters

[57] ABSTRACT

A non-impact form of thermocompression gang bonding of metal lead fingers to integrated circuit chip pads is disclosed. The method produces a plurality of simultaneously bonded chips using conventional heating means and totally avoids mechanical and thermal shock. The result is highly reliable bonding that results in exceptionally high bond strength.

3 Claims, 4 Drawing Figures

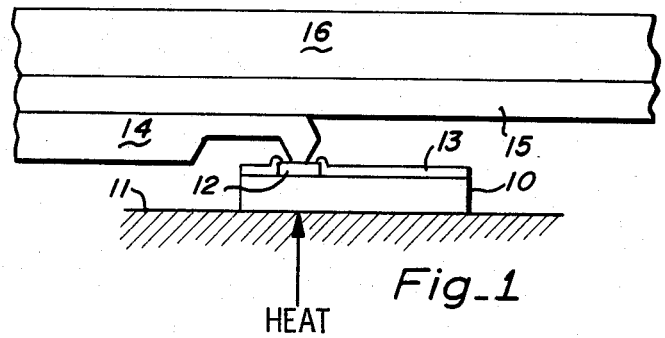
Fig_1
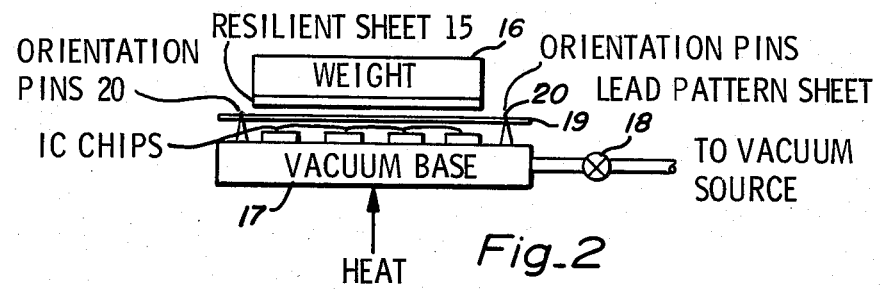
Fig_2
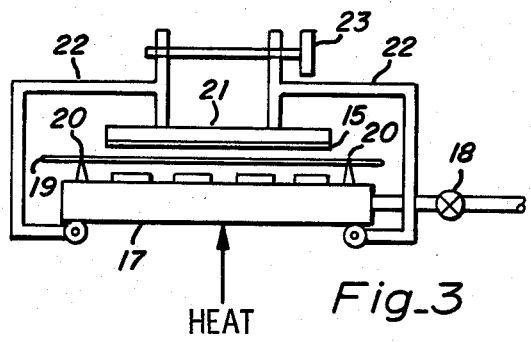
Fig_3
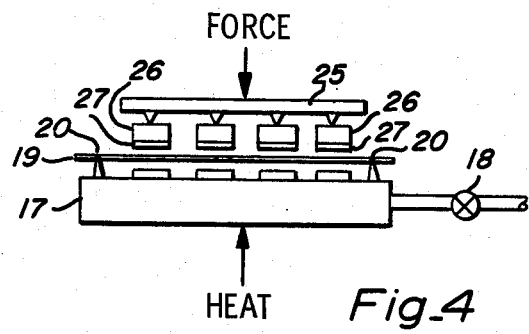
Fig_4

NON-IMPACT THERMOCOMPRESSION GANG BONDING METHOD

BACKGROUND OF THE INVENTION

Thermocompression (TC) gang bonding is taught in my U.S. Pat. Nos. 4,000,842 and 4,063,993. Both relate to what is known as tape automated bonding (TAB). An assembly tape is provided with a succession of metal finger patterns. The inner ends of the fingers form arrays that mate with the bonding pads of semiconductor devices, such as integrated circuit (IC) chips, that are to be contacted. The outer ends of fingers are arrayed to either form package pins or to mate with a packaging structure or other mounting device. In TAB the finger array is first registered with respect to the IC bonding pads and the fingers are TC gang bonded for a permanent connection. Ordinarily, a heated bonding tool, called a thermode, is pressed against the ends of the finger to be bonded with sufficient pressure to deform the metal. Sufficient heat and pressure is employed to create reliable bonds. However, as TAB production rates are increased, the semiconductor devices receive less individual processing time. At a rate of 3600 per hour the total cycle time is only one second. In this time the tape must be advanced halted and precisely located relative to the semiconductor device. Then the hot thermode is pressed against the fingers to achieve bonding. Thus a bond, which must produce some metal deformation, is accomplished in a fraction of a second. Clearly an impact is involved. As the TAB production rates are increased still further such impact becomes more pronounced. One problem that develops at high rates is the fracturing of the semiconductor. It is well known that silicon is a brittle, easily fractured material. As is pointed out above, the impact is accompanied by a substantial temperature rise so a thermal shock is also present. These factors conspire to set upper productivity limits for TAB machines operated using a single thermode. Accordingly, a non-impact bonding operation would be preferred.

SUMMARY OF THE INVENTION

It is an object of the invention to accomplish thermocompression gang bonding without employing impact.

It is a further object of the invention to gently press a metal finger against a semiconductor device bonding pad and then heat the assembly to a relatively low bonding temperature for a sufficient length of time to produce bonding.

These and other objects are achieved as follows: A rigid base plate is provided with a plurality of precisely located and oriented semiconductor devices using conventional locating and orienting techniques. Then a preformed lead pattern array is located on top of the semiconductor devices. The location is achieved so that a plurality of metal finger arrays are precisely oriented with the semiconductor device bonding pads. Then a resilient pressure distributing pad composed of, for example, polyimide sheet is located over the lead pattern array. A weight or pressure plate is then located on top of the polyimide sheet. The weight (or pressure) is selected so that the desired individual finger bonding pressure is achieved. The assembly is then heated to bonding temperature for a relatively long period of cycle (typically in the order of minutes) to achieve bonding. The relatively gentle assembly avoids any tool impact and the heating time can be adjusted to achieve the desired degree of bonding. I have discovered that semiconductor device fracturing can be entirely eliminated while achieving bonds that are unexpectedly better than those achieved using impact thermodes. Since a large number of semiconductor devices can be fabricated simultaneously, throughput is high even though the bonding cycle time is relatively long.

If desired, a plurality of base plates with their overlying layers of semiconductor devices, lead patterns and polyimide sheets can be stacked up and pressed together in a clamp. This assembly can then be heated by furnace or other means to achieve bonding.

BRIEF DESCRIPTION OF THE DRAWING

FIG. 1 is a schematic showing of the elements of the invention.

FIG. 2 shows one embodiment of the apparatus for practicing the invention.

FIG. 3 shows an alternative embodiment for practicing the invention.

FIG. 4 shows another alternative embodiment for practicing the invention.

DESCRIPTION OF THE INVENTION

FIG. 1 illustrates, in substantially schematic form the broad elements of the invention. Semiconductor device 10 is shown in the form of an IC chip resting upon a base plate 11. A metal contact finger 14 is to be TC bonded to a bonding pad 12 on the chip. The IC chip also includes a well known passivating layer 13. While not shown, pad 12 can be overcoated with suitable thin layers of contact forming and/or barrier material.

It is to be understood that while a single chip is shown, a plurality will ordinarily be located upon base plate 11. Also, while a single contact pad 12 and finger 14 is shown, each chip will carry a plurality of such contacts. Finger 14 represents one element in a lead pattern array in which all of the contact elements are fabricated simultaneously in sheet form. I prefer to employ 2.8 mil thick rolled full hard 110 copper alloy hard as the starting material. Two sided photolithographic etching of the sheet is employed to create the contact array. TC bonding bumps can therefore be fabricated into one face while the other face is etched to produce the gross finger pattern shape. Using this technique each face is etched approximately half way through the sheet. The finger patterns are thus simultaneously produced for the array of IC chips to be bonded. Etching can be controlled with sufficient accuracy over a relatively large area so that a great many such chips can be handled simultaneously.

In operation a plurality of IC chips are located on base plate 11 and oriented in accordance with the patterns created in the above mentioned lead pattern array. This can be done using conventionally available optical recognition and positioning equipment (not illustrated). Then the metal sheet containing the registered lead patterns is laid down over the chips so as to be in registry therewith. Then a sheet 15 of resilient pressure distributing material is laid over the lead pattern sheet. I prefer to use Kapton (a polyimide material available from DuPont) 2 to 5 mils thick. Such a material is suitably resilient and can tolerate extended periods at elevated temperatures without degradation of its physical properties. Finally, a weight plate 16 is laid on top of resilient sheet 15. The weight is selected to provide between 20 and 100 grams of force per chip finger. As can be seen in FIG. 1, all of the force is concentrated on the bump at the end of finger 14. Thus, the total weight is simply made equal to the number of fingers multiplied by the desired force per finger. Heat is applied for a period of time and at a temperature suitable for TC bonding While the heating can often be accomplished in air, I prefer to use a reducing atmosphere to maintain the copper surfaces clean. Forming gas (10% hydrogen and 90% nitrogen) is an effective ambient.

Since TC bonding bumps typically have a face area of about 1875 square microns, the force typically runs between 10 and 50 milligrams per square micron of actual bond area. A typical firing can be on the order of 325° C. for about 15 minutes with relatively slow heating and cooling rates. Thus, the heating is at a relatively low temperature that is substantially below any of the metal eutectic temperatures for the metal system. The above-described process provides bonding without thermal or mechanical shock and totally avoids the silicon cratering sometimes encountered using impact thermode TC gang bonding.

The bonding method provides adequate non-impact assembly and also produces an unexpected result. Using the impact thermode assembly method of the prior art produces a typical bond strength of about 37 grams. This means that it requires a 37 gram force to remove the finger from the chip. Using the non-impact method described above produces typical bond strengths of about 50 grams using identical parts otherwise. Since there is no impact, the shape of the bonding bump is less critical. This also means that the bump face area can be increased if a still stronger joint is desired. Larger bumps have been employed to produce 85 gram bond strengths while still achieving the other advantages of non-impact bonding.

FIG. 2 shows a proposed assembly useful in practicing the invention. A vacuum base 17 is coupled via valve 18 to a source of vacuum. The base 17 has a flat rigid surface which includes a plurality of holes in a well known vacuum holding configuration. With the vacuum off (valve 18 closed), IC chips are located on the surface of base 17 in a predetermined pattern and orientation. Using available optical recognition equipment and automatic handling equipment (not shown) chips can be placed to an accuracy of better than ±20 microns. This is adequate to locate the chip bonding pads with respect to fingers to be bonded thereto. Then valve 18 is opened to apply vacuum to base 17. This will securely hold the chips in place on the surface. Then a sheet 19 containing an etched array of contact finger patterns is located on base 17. Sheet 19 is precisely located with respect to base 17 by means of locater pins 20 which act to orient and locate sheet 19. Sheet 19 contains a lead pattern for each IC chip located on base 17. These patterns are precision preetched into a copper foil sheet with the pattern being customized to the IC requirements. The artwork employed in the photolithographic etching of sheet 19 can also be used to program the automatic handling pattern recognition equipment used to locate the IC chips on base 17. Weight 16 and resilient sheet 15 are as was described for the FIG. 1 showing. After assembly, as shown, the vacuum line is disconnected and the assembled fixture transferred to an oven for firing as described above.

FIG. 3 shows an alternative assembly arrangement where weight 16 has been replaced with force-distributing plate 21 and clamping means. The clamping means includes hinged toggles 22 and thumb screw 23. When screw 23 is tightened after assembly as described in FIG. 2 toggles 22 apply force to plate 21. Resilient sheet 15 distributes the force to the lead pattern sheet 19. The vacuum base is employed as was the case in FIG. 2 to initially hold the located IC chips in place. Then sheet 19 is located on pins 20 and sheet 15 and pressure plate 21 applied. Then toggles 22 are swung into place and thumb screw 23 tightened to provide the desired pressure. Once screw 23 is tightened to provide the required force on plate 21, the vacuum line can be disconnected and the assembly heated as described above. The embodiment of FIG. 3 has the advantage of being capable of manipulation once it has been assembled. Great care must be used in the treatment of the FIG. 2 embodiment after assembly to avoid disturbing the location and orientation of the IC chips after the vacuum is turned off.

FIG. 4 is another alternative assembly arrangement. The vacuum base 17 is as was described for FIGS. 2 and 3 along with contact finger arrayt sheet 19 and locater pins 20. In this embodiment of the invention each IC chip has its own individual pressure plate 26 and resilient facing 27. Plate 25 distributes the applied force (which could be achieved by a weight as in FIG. 2 or pressure applying toggles as in FIG. 3) to the individual pressure plates. Some means, such as the projections shown on plate 25, must be present so that the individual plates 26 can swivel with respect to plate 25 thereby to accommodate unevenness in base 17. Such an approach would be employed where a very large number of chips would be involved and it would be difficult to make the surface of base 17 suitably flat.

The manner of heating is shown schematically and is not detailed because it is conventional. Once the chip and lead pattern sheet has been assembled in precision alignment, any form of heat application can be employed. For example, the assembly can merely be placed upon a hot plate and heated for a time and temperature to produce bonding. Desirably the assembly is confined inside a controlled atmosphere again using conventional means. If desired the assembly can be passed, upon a conveyor belt, through a conventional muffle furnace where a desired temperature profile and atmosphere is established. The heating duration is established by the conveyor belt speed. In another heating method the assembled parts can be made a part of a gas flow plenum and heated gas (such as forming gas) passed through. In this case the thermal mass of the assemblies should be reduced to a minimum so as to minimize the required heat and cool cycle durations.

The invention has been described and a suitable sheet of bonding conditions detailed. When a person skilled in the art reads the foregoing description, alternatives and equivalents, that are within the spirit and intent of the invention, will be apparent. Accordingly, it is intended that the scope of the invention be limited only by the following claims.

I claim:

1. A non-impact thermocompression gang bonding process comprising the steps:
    locating a plurality of semiconductor device chips in predetermined positions and orientations on a substantially rigid flat surface, said chips having upwardly facing bonding pads;
    laying a copper lead pattern array on top of said chips, said array comprising a plurality of copper fingers each one of which has a bonding bump at its end extending in the plane of said array, said copper fingers being formed and arrayed so that their bumps form patterns that mate with the bonding pad patterns on said chips;

locating said array so that said bumps on said metal fingers register with said bonding pads;

applying a resilient pressure distributing sheet on top of said array;

clamping a flat plate onto said pressure distributing sheet, whereby each finger in said array is pressed against its associated bonding pad with a pressure of about 20 to 100 grams; and heating said chips in contact with said fingers at about 325° C. for about 15 minutes to bond said fingers to said chips with said temperature being substantially below any metal eutectic temperature in the system.

2. A non-impact thermocompression gang bonding process comprising the steps:

locating a plurality of semiconductor device chips in predetermined positions and orientation on a substantially rigid flat surface, said chips having upwardly facing bonding pads;

laying a copper lead pattern array on top of said chips, said array comprising a plurality of copper fingers each one of which has a bonding bump at its end extending in the plane of said array, said copper fingers being formed and arrayed so that their bumps form patterns that mate with the pad patterns on said chips;

locating said array so that said bumps on said metal fingers register with said bonding pads;

applying a resilient pressure distributing sheet on top of said array;

applying a flat plate onto said pressure distributing sheet and locating a suitable weight thereon whereby each finger in said array is pressed against its associated bonding pad with a pressure of about 20 to 100 grams; and heating said chips in contact with said fingers at about 325° C. for about 15 minutes to bond said fingers to said chips with said temperature being substantially below any metal eutectic temperature in the system.

3. The process of claims 1 or 2 wherein said heating step is accomplished in a reducing atmosphere.

* * * * *